US011472665B2

(12) United States Patent
Inoue et al.

(10) Patent No.: US 11,472,665 B2
(45) Date of Patent: Oct. 18, 2022

(54) ELEVATOR CAR POSITION DETECTION SENSOR THAT DETERMINES A PHASE OF AN ALTERNATING-CURRENT VOLTAGE CORRESPONDING TO A FREQUENCY OF AN EXCITATION MAGNETIC FIELD

(71) Applicant: Mitsubishi Electric Corporation, Tokyo (JP)

(72) Inventors: Jin Inoue, Tokyo (JP); Keita Mochizuki, Tokyo (JP); Masahiro Ishikawa, Tokyo (JP); Akihide Shiratsuki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 426 days.

(21) Appl. No.: 16/483,043

(22) PCT Filed: May 10, 2017

(86) PCT No.: PCT/JP2017/017719
§ 371 (c)(1),
(2) Date: Aug. 2, 2019

(87) PCT Pub. No.: WO2018/207291
PCT Pub. Date: Nov. 15, 2018

(65) Prior Publication Data
US 2020/0231407 A1    Jul. 23, 2020

(51) Int. Cl.
*B66B 3/02*    (2006.01)
*H01H 36/00*    (2006.01)

(52) U.S. Cl.
CPC ............... *B66B 3/02* (2013.01); *H01H 36/00* (2013.01)

(58) Field of Classification Search
CPC .................................. H01H 36/00; B66B 3/02
See application file for complete search history.

(56) References Cited

U.S. PATENT DOCUMENTS

2017/0043976 A1*   2/2017   Inoue .................... B66B 5/0018
2021/0354954 A1*   11/2021  Mochizuki ............ B66B 1/3492

FOREIGN PATENT DOCUMENTS

| JP | 46-4910 Y1 | 2/1971 |
| JP | 61-3404 U | 1/1986 |

(Continued)

OTHER PUBLICATIONS

Office Action dated Mar. 9, 2021 in Korean Patent Application No. 10-2019-7031987, 8 pages.

(Continued)

*Primary Examiner* — Tammara R Peyton
(74) *Attorney, Agent, or Firm* — Xsensus LLP

(57) ABSTRACT

To provide an elevator car position detection sensor capable of suppressing erroneous detection of presence or absence of a plate. The elevator car position detection sensor includes a first coil provided to one of an elevator car and a hoistway and configured to output an excitation magnetic field to a plate provided to the other of the elevator car and the hoistway; a second coil provided on an opposite side of the first coil relative to the plate; a shield wall configured to shield an end portion of the plate located closer to one of the car and the hoistway; and a determination circuit configured to determine a phase of an alternating-current voltage corresponding to a frequency of the excitation magnetic field output from the first coil at an alternating-current voltage generated across the second coil.

5 Claims, 6 Drawing Sheets

(56) References Cited

FOREIGN PATENT DOCUMENTS

JP         2014-156350 A     8/2014
WO      2016/084203 A1    6/2016

OTHER PUBLICATIONS

International Search Report and Written Opinion dated Jul. 25, 2017 for PCT/JP2017/017719 filed on May 10, 2017, 9 pages including English Translation of the International Search Report.
Office Action dated Sep. 25, 2020 in the corresponding CN patent application No. 201780090380.4.
Office Action dated Sep. 29, 2020 in the corresponding JP patent application No. 2019-516800.
Office Action dated Nov. 24, 2020 in the corresponding IN patent application No. 201947042026.

* cited by examiner

| PRESENCE/ ABSENCE OF DISTURBANCE ELECTROMAGNETIC WAVE | PRESENCE/ ABSENCE OF PLATE | AMPLITUDE OF VOLTAGE $V_1$ OF FIRST COIL | AMPLITUDE OF VOLTAGE $V_2$ OF SECOND COIL | PHASE DIFFERENCE | OUTPUT VOLTAGE $V_{OUT}$ |
|---|---|---|---|---|---|
| ABSENT | ABSENT | LARGE | LARGE | 0° | H |
| | PRESENT | LARGE | LARGE | 180° | L |
| PRESENT | ABSENT | LARGE | SMALL TO LARGE | 0° | H |
| | PRESENT | LARGE | SMALL TO LARGE | 180° | H |

# ELEVATOR CAR POSITION DETECTION SENSOR THAT DETERMINES A PHASE OF AN ALTERNATING-CURRENT VOLTAGE CORRESPONDING TO A FREQUENCY OF AN EXCITATION MAGNETIC FIELD

CROSS-REFERENCE TO RELATED APPLICATIONS

The present application is based on PCT filing PCT/JP2017/017719, filed May 10, 2017, the entire contents of which are incorporated herein by reference.

FIELD

The present invention relates to an elevator car position detection sensor.

BACKGROUND

For example, PTL 1 discloses an elevator car position detection device.

According to the car position detection device, it is possible to detect the position of a car, while preventing a car position detection sensor and a plate from contacting each other.

CITATION LIST

Patent Literature

[PTL 1] JP S61-3404 A

SUMMARY

Technical Problem

However, in the car position detection device described in PTL 1, a voltage can be generated across a coil due to a disturbance electromagnetic wave. In this case, the presence or absence of the plate may not be detected normally in some cases.

The present invention has been made to solve the above-described problem. An object of the present invention is to provide an elevator car position detection sensor capable of suppressing erroneous detection of presence or absence of a plate.

Solution to Problem

An elevator car position detection sensor according to the present invention includes a first coil provided to one of an elevator car and a hoistway and configured to output an excitation magnetic field to a plate provided to the other of the elevator car and the hoistway; a second coil provided on an opposite side of the first coil relative to the plate; a shield wall configured to shield an end portion of the plate located closer to one of the car and the hoistway; and a determination circuit configured to determine a phase of an alternating-current voltage corresponding to a frequency of the excitation magnetic field output from the first coil at an alternating-current voltage generated across the second coil.

Advantageous Effects of Invention

According to the present invention, the determination circuit determines fixe phase of the alternating-current voltage corresponding to the frequency of the excitation magnetic field output from the first coil at the alternating-current voltage generated across the second coil. In this case, the presence or absence of the plate is determined based on the phase, thereby making it possible to suppress erroneous detection of the presence or absence of the plate.

DESCRIPTION OF EMBODIMENTS

Figure 1:
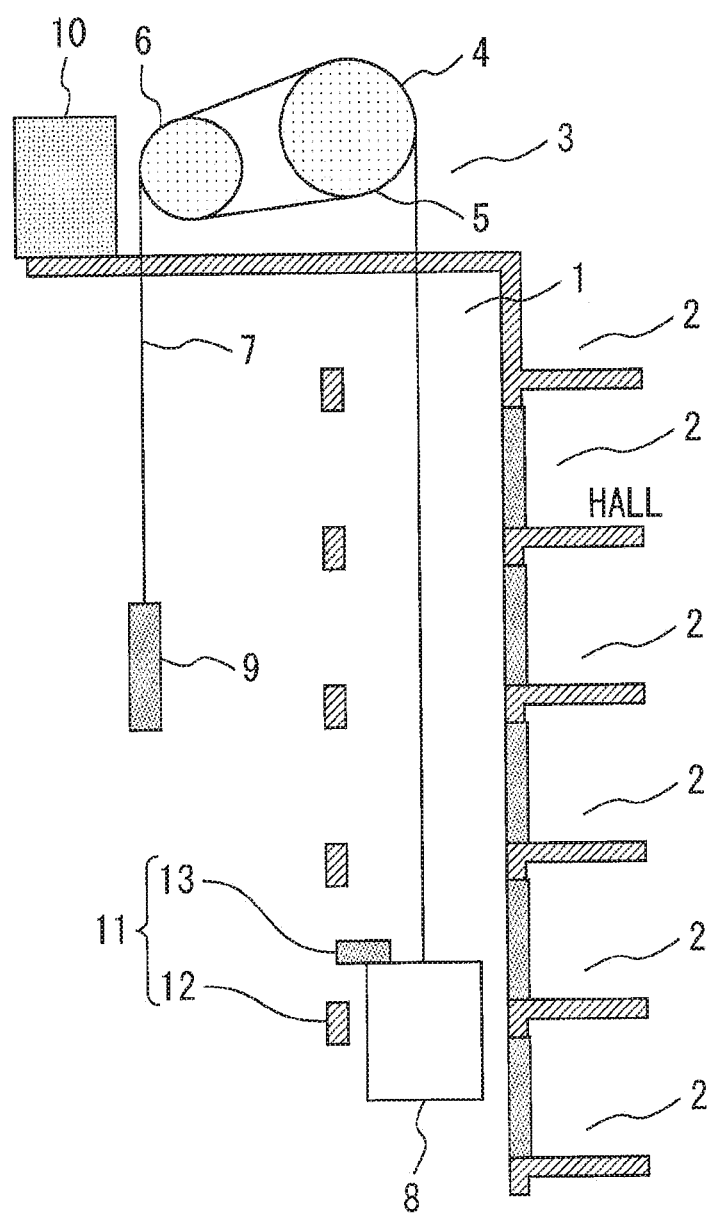
FIG. 1 is a structural diagram of an elevator system to which an elevator car position detection sensor according to Embodiment 1 of the present invention.

Modes for carrying out the present invention will be described with reference to the accompanying drawings. Note that in the drawings, the same or corresponding parts are denoted by the same reference numerals. Redundant descriptions of the parts are simplified or omitted as needed.

Embodiment 1

FIG. 1 is a structural diagram of an elevator system to which an elevator car position detection sensor according to Embodiment 1 of the present invention is app In an elevator illustrated in FIG. 1, a hoistway 1 penetrates each floor of a building. Each of the plurality of halls 2 of the elevator is provided at each floor of the building. Each of the plurality of halls 2 faces the hoistway 1. A machine room 3 is provided on the hoistway 1.

A hoisting machine 4 is provided inside the machine room 3. A sheave 5 is attached to a rotary shaft of the hoisting machine 4. A deflector sheave 6 is provided inside the machine room 3. A main rope 7 is wound around each of the sheave 5 and the deflector sheave 6.

An elevator car 8 is provided inside the hoistway 1. The car 8 is suspended on one side of the main rope 7. A weight 9 is provided inside the hoistway 1. The weight 9 is suspended on the other side of the main rope 7.

A car position detection device 11 includes a plurality of plates 12 and a car position detection sensor 13.

The plurality of plates 12 is provided side by side in the vertical direction inside the hoistway 1. Each of the plurality of plates 12 is provided so as to correspond to each floor of a building. For example, each of the plurality of plates 12 is formed of metal. The car position detection sensor 13 is provided on a ceiling of the car 8. The car position detection sensor 13 is provided so as to sandwich the plate 12 corresponding to each floor when the car 8 reaches each floor of the building.

For example, the machine room 3 is provided with a control device 10. The control device 10 is provided so as to be able to control the overall elevator.

Next, the car position detection sensor 13 will be described with reference to FIGS. 2 and 3.

Figure 2:
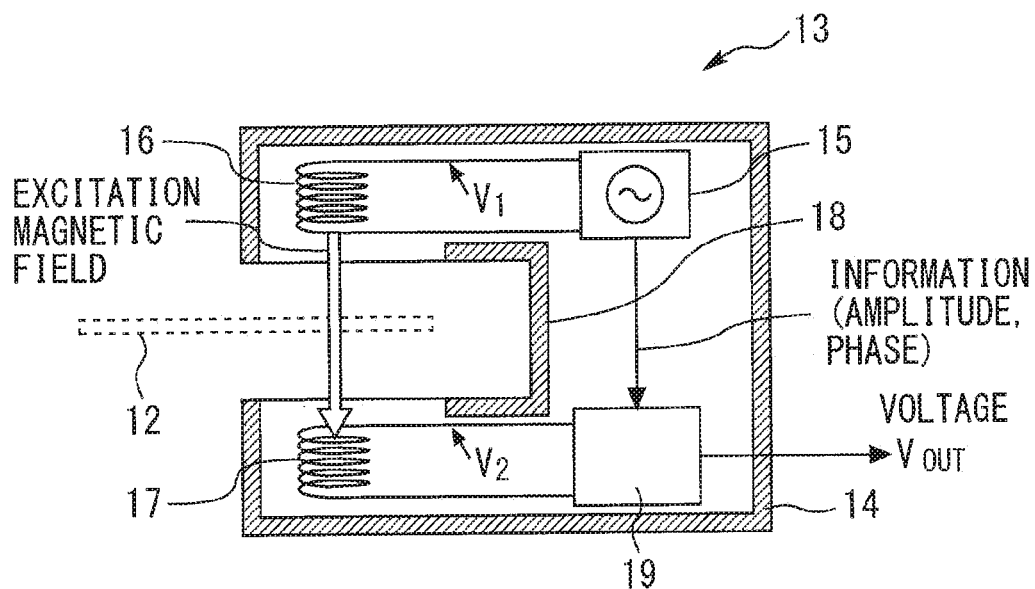
FIG. 2 is a plan view of the elevator car position detection sensor according to Embodiment 1 of the present invention.
Figure 3:
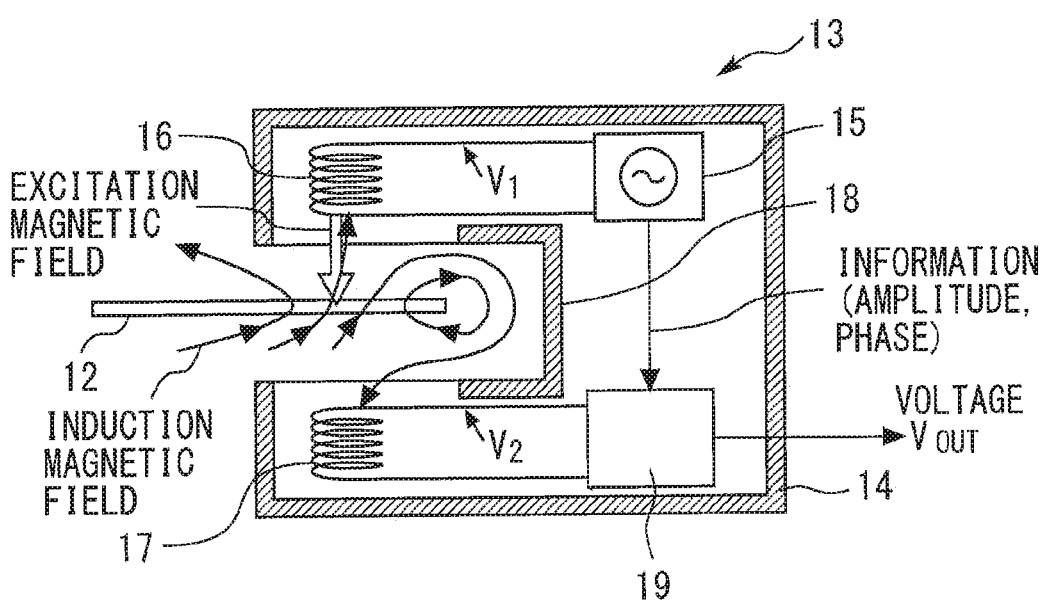
FIG. 3 is a plan view of the elevator car position detection sensor according to Embodiment 1 of the present invention.

FIGS. 2 and 3 are plan views each illustrating the elevator car position detection sensor according to Embodiment 1 of the present invention.

As illustrated in FIGS. 2 and 3, the car position detection sensor 3 includes a housing 14, an alternating current source 15, a first coil 16, a second coil 17, a shield wall 18, and a determination circuit 19.

The housing 14 forms an external body of the car position detection sensor 13. The housing 14 is formed in a U-shape. For example, the housing 14 is formed of metal.

The alternating current source 15 is provided on one side and on a back side inside the housing 14. The alternating current source 15 is provided so as to be able to output an alternating-current voltage.

The first coil 16 is provided on one side and on a front side inside the housing 14. The first coil 16 is connected to the alternating current source 15. The first coil 16 is provided so as to be able to output an excitation magnetic field to the corresponding plate 12 based on a voltage $V_1$ supplied from the alternating current source 15.

The second coil 17 is provided on an opposite side of the first coil 16 relative to the plate 12. Specifically, the second coil 17 is provided on the other side and on the front side inside the housing 14.

The shield wall 18 is provided on an outside of the housing 14 so as to shield an end portion of the plate 12 located closer to the car 8. For example, the shield wall 18 formed of metal.

The determination circuit 19 is provided on the other side and on the back side inside the housing 14. The determination circuit 19 is connected to the second coil 17. The determination circuit 19 is provided so as to be able to determine a phase of an alternating-current voltage corresponding to a frequency of an excitation magnetic field output from the first coil 16 at an alternating-current voltage generated across the second coil 17.

As illustrated in FIG. 2, when the plate 12 is not present between the first coil 16 and the second coil 17, the second coil 17 directly receives an input of an excitation magnetic field from the first coil 16. In this case, a voltage $V_2$ corresponding to the excitation magnetic field is generated across the second coil 17.

As illustrated in FIG. 3, when plate 12 is present between the first coil 16 and the second coil 17, the second coil 17 receives an input of an induction magnetic field through the plate 12. In this case, the phase of the induction magnetic field is different from the phase of the excitation magnetic field from the first coil 16 by 180°. In this case, the voltage $V_2$ corresponding to the induction magnetic field is generated across the second coil 17.

The determination circuit 19 receives an input of amplitude information and phase information about the voltage $V_1$ supplied from the alternating current source 15. The determination circuit 19 compares the phase of the voltage $V_1$ of the first coil 16 with the phase of voltage $V_2$ of the second coil 17 based on the information received from the alternating current source 15. The determination circuit 19 determines an output voltage $V_{out}$ depending on the result of the comparison between the phase of the voltage $V_1$ of the first coil 16 and the phase of the voltage $V_2$ of the second coil 17.

Next, a method for detecting the plate 12 will be described with reference to FIG. 4.

Figure 4:
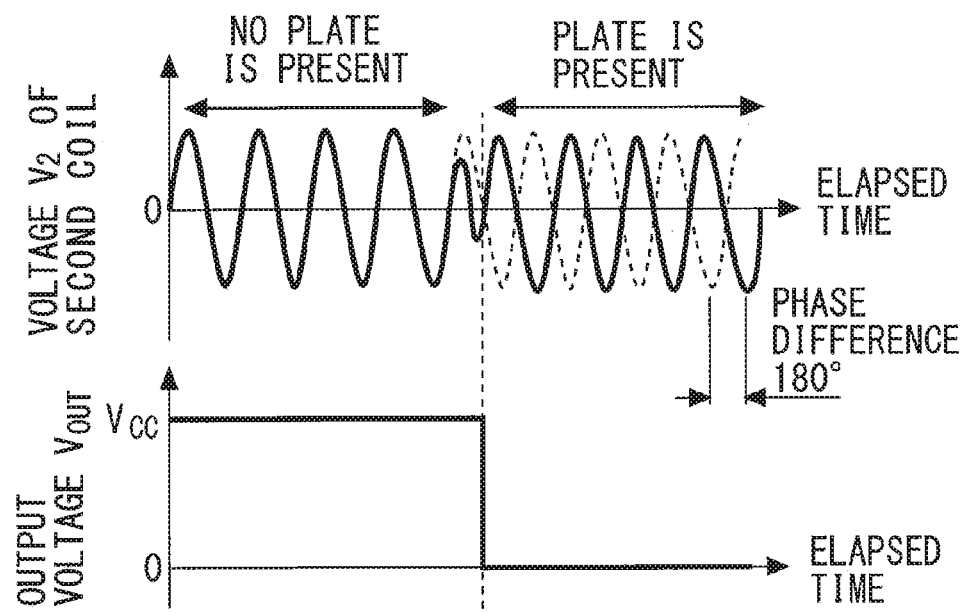
FIG. 4 is a graph illustrating a voltage of a second coil and an output voltage of a determination circuit in the elevator car position detection sensor according to Embodiment 1 of the present invention.

FIG. 4 is a graph illustrating a voltage of the second coil and an output voltage of the determination circuit in the elevator car position detection sensor according to Embodiment 1 of the present invention.

In FIG. 4, when the plate 12 is not present between the first coil 16 and the second coil 17, the second coil 17 directly receives the input of the excitation magnetic field from the first coil 16. In this case, the determination circuit 19 determines that the phase of the voltage $V_1$ of the first coil 16 is the same as the phase of the voltage $V_2$ of the second coil 17. In this case, the determination circuit 19 outputs $V_{cc}$ as the output voltage $V_{out}$.

On the other hand, when the plate 12 is present between the first coil 16 and the second coil 17, the second coil 17 receives the input of the induction magnetic field through the plate 12. In this case, the determination circuit 19 determines that the phase of the voltage $V_1$ of the first coil 16 is different from the phase of the voltage $V_2$ of the second coil 17 by 180°. In this case, the determination circuit 19 outputs "0" as the output voltage $V_{out}$.

Next, an influence of a disturbance electromagnetic wave will be described with reference to FIG. 5.

Figure 5:
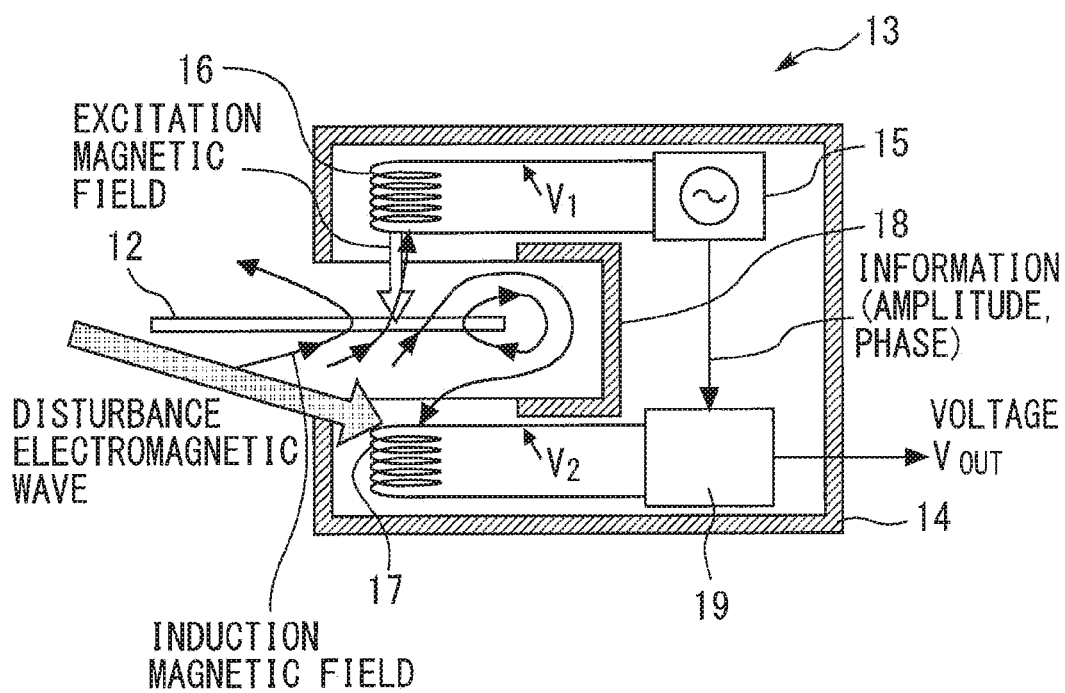
FIG. 5 is a plan view of the elevator car position detection sensor according to Embodiment 1 of the present invention.
Figures 6, 7:
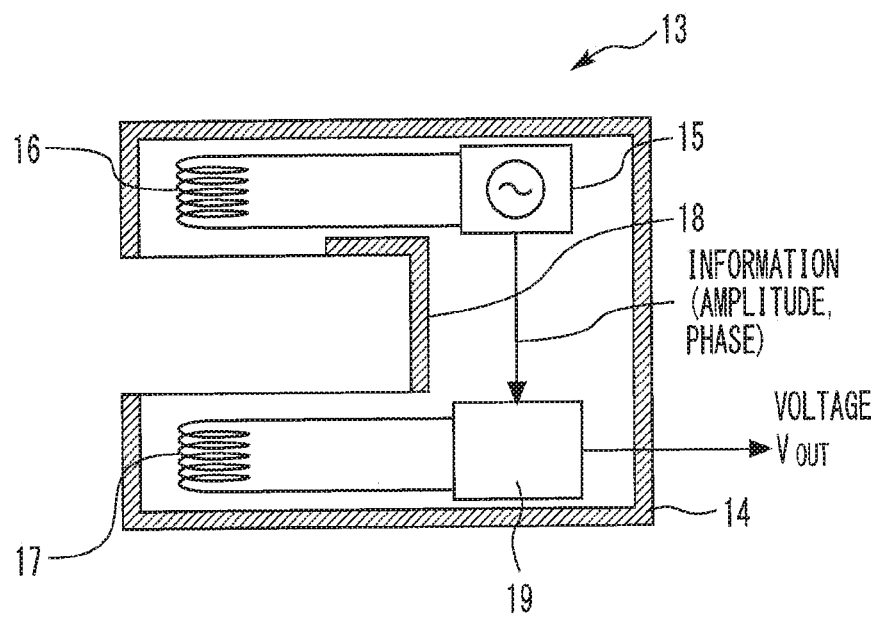
FIG. 6 is a table illustrating operation states of the elevator car position detection sensor according to Embodiment 1 of the present invention.
FIG. 7 is a plan view of an elevator car position detection sensor according to Embodiment 2 of the present invention.

FIG. 5 is a plan view of the elevator car position detection sensor according to Embodiment 1 of the present invention. FIG. 6 is a table illustrating operation states of the elevator car position detection sensor according to Embodiment 1 of the present invention.

As illustrated in FIG. 5, a disturbance electromagnetic wave may be input to the second coil 17. In this case also, the induction magnetic field from the plate 12 is guided to the second coil 17 without being diffused by the shield wall 18.

As illustrated in FIG. 6, the voltage $V_2$ generated across the second coil 17 constantly maintains a sufficiently large amplitude even when the disturbance electromagnetic wave is present.

According to Embodiment 1 described above, the determination circuit 19 determines the phase of the alternating-current voltage corresponding to the frequency of the excitation magnetic field output from the first coil 16 at the alternating-current voltage generated across the second coil 17. In this case, the determination based on the phase as to whether the plate 12 is present or not based on the phase makes it possible to suppress erroneous detection of presence or absence of the plate 12.

Further, the shield wall 18 shields an end portion of the plate 12 located closer to the car 8 at a side closer to the first coil 16, at a side closer to a tip end of the plate, and at a side closer to the second coil 17. Accordingly, the induction magnetic field from the plate 12 can be reliably guided to the second coil 17. As a result, the phase of the voltage $V_2$ generated across the second coil 17 in the case where the plate 12 is present between the first coil 16 and the second coil 17 changes by 180° from the case where the plate 12 is not present between the first coil 16 and the second coil 17. In this case, the amplitude and frequency of the voltage $V_2$ generated across the second coil 17 do not change. Therefore, the voltage $V_2$ generated across the second coil 17 can constantly maintain a sufficiently larger amplitude than that of the disturbance electromagnetic wave. As a result, erroneous detection of presence or absence of the plate 12 can be reliably suppressed.

Embodiment 2

FIG. 7 is a plan view of an elevator car position detection sensor according to Embodiment 2 of the present invention. Note that parts identical or corresponding to those in Embodiment 1 are denoted by the same reference numerals. The descriptions of the parts are omitted.

The shield wall 18 according to Embodiment 2 shields an end portion of the plate 12 located closer to the car 8 at the side closer to the first coil 16 and at the side closer to the tip end of the plate, without shielding the end portion of the plate at the side closer to the second coil 17.

According to Embodiment 2 described above, the shield wall 18 can be achieved with a simple structure. This leads to a reduction in the cost of the shield wall 18.

However, as compared with Embodiment 1, the induction magnetic field toward the second coil 17 is reduced. Accordingly, the shield wall 18 according to Embodiment 2 is also effective in an environment in which the disturbance electromagnetic wave is weak.

Embodiment 3

Figure 8:
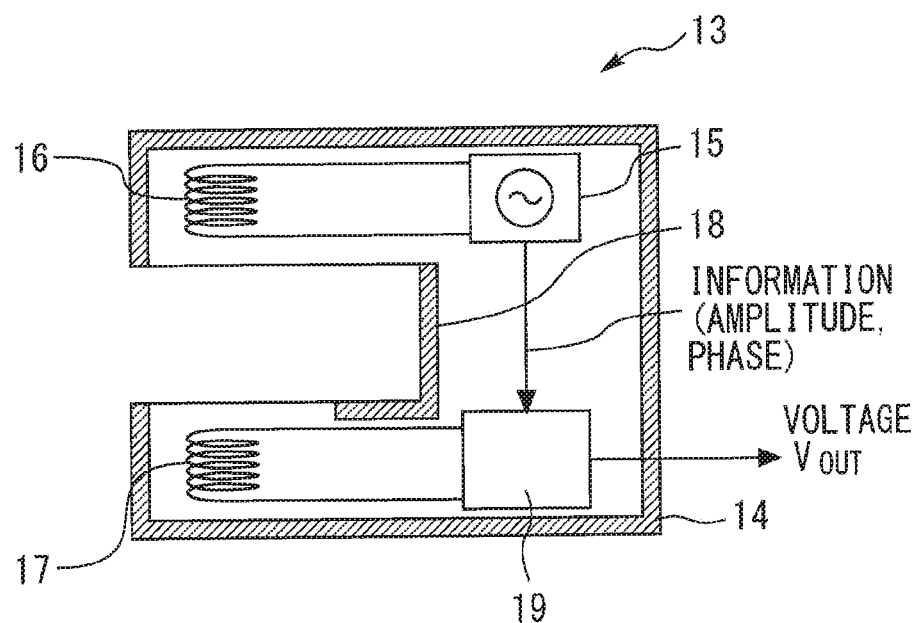
FIG. 8 is a plan view of an elevator car position detection sensor according to Embodiment 3 of the present invention.

FIG. 8 is a plan view of an elevator car position detection sensor according to Embodiment 3 of the present invention. Note that parts identical or corresponding to those in Embodiment 1 are denoted by the same reference numerals. The descriptions of the parts are omitted.

The shield wall 18 according to Embodiment 3 shields an end portion of the plate 12 located closer to the car 8 at the side closer to second coil 17 and at the side closer to the tip end of the plate, without shielding the end portion of the plate at the side closer to the first coil 16.

According to Embodiment 3 described above, the shield wall 18 can be achieved with a simple structure. This leads to a reduction in the cost of the shield wall 18.

However, as compared with Embodiment 1, the induction magnetic field toward the second coil 17 is reduced. Accordingly, the shield wall 18 according to Embodiment 3 is also effective in an environment in which the disturbance electromagnetic wave is weak.

Embodiment 4

Figure 9:
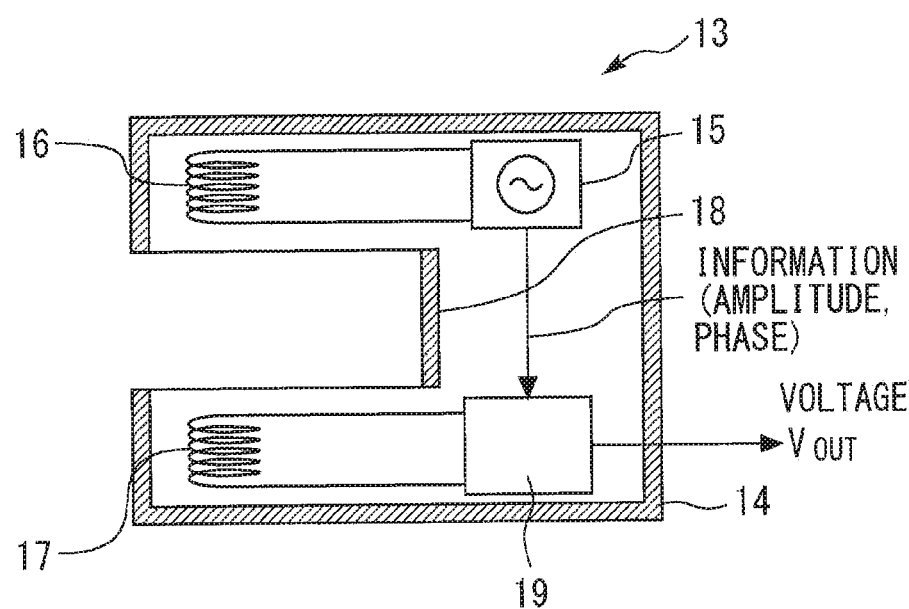
FIG. 9 is a plan view of an elevator car position detection sensor according to Embodiment 4 of the present invention.

FIG. 9 is a plan view of an elevator car position detection sensor according to Embodiment 4 of the present invention. Note that parts identical or corresponding to those in Embodiment 1 are denoted by the same reference numerals. The descriptions of the parts are omitted.

The shield wall 18 according to Embodiment 4 shields an end portion of the plate 12 located closer to the car 8 at the side closer to the tip end of the plate, without shielding the end portion of the plate at the side closer to the first coil 16 and the side closer to the second coil 17.

According to Embodiment 4 described above, the shield wall 18 can be achieved with a simple structure. This leads to a reduction in the cost of the shield wall 18.

However, as compared with Embodiment 1, the induction magnetic field toward the second coil 17 is reduced. Accordingly, the shield wall 18 according to Embodiment 4 is also effective in an environment in which the disturbance electromagnetic wave is weak.

Embodiment 5

Figure 10:
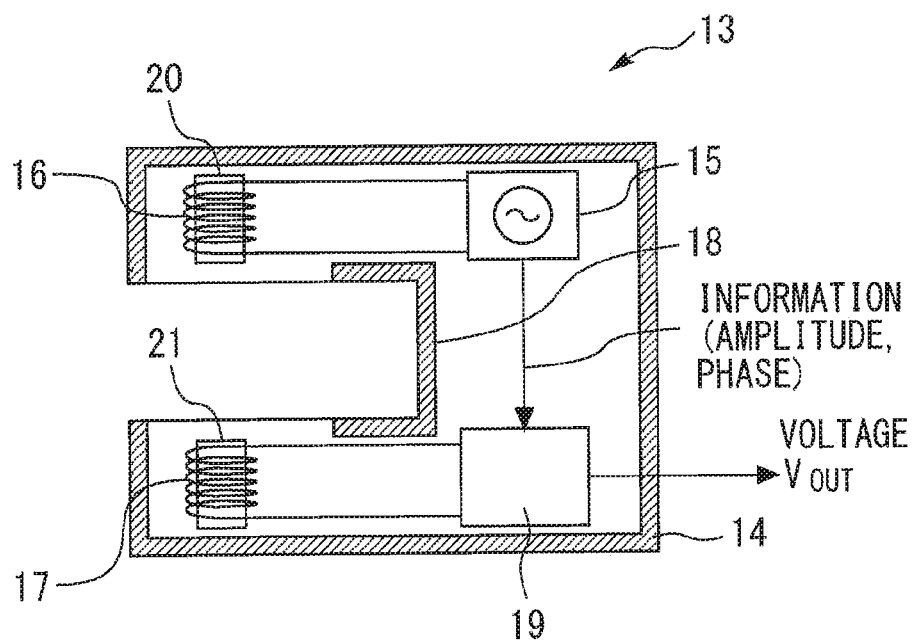
FIG. 10 is a plan view of an elevator car position detection sensor according to Embodiment 5 of the present invention.

FIG. 10 is a plan view of an elevator car position detection sensor according to Embodiment 5 of the present invention. Note that parts identical or corresponding to those in Embodiment 1 are denoted by the same reference numerals. The descriptions of the parts are omitted.

The car position detection sensor 13 according to Embodiment 5 is a sensor having a structure in which a first yoke 20 and a second yoke 21 are added to the car position detection sensor 13 according to Embodiment 1.

The first yoke 20 is provided on an inside of the first coil 16. The second yoke 21 is provided on an inside of the second coil 17.

According to Embodiment 5 described above, the voltage of the second coil 17 is increased due to a magnetism collection effect between the first yoke 20 and the second yoke 21. As a result, an SN ratio is improved. Therefore, it is possible to suppress erroneous detection due to the disturbance electromagnetic wave. As a result, the accuracy of detecting the position of the car 8 can be improved.

Embodiment 6

Figure 11:
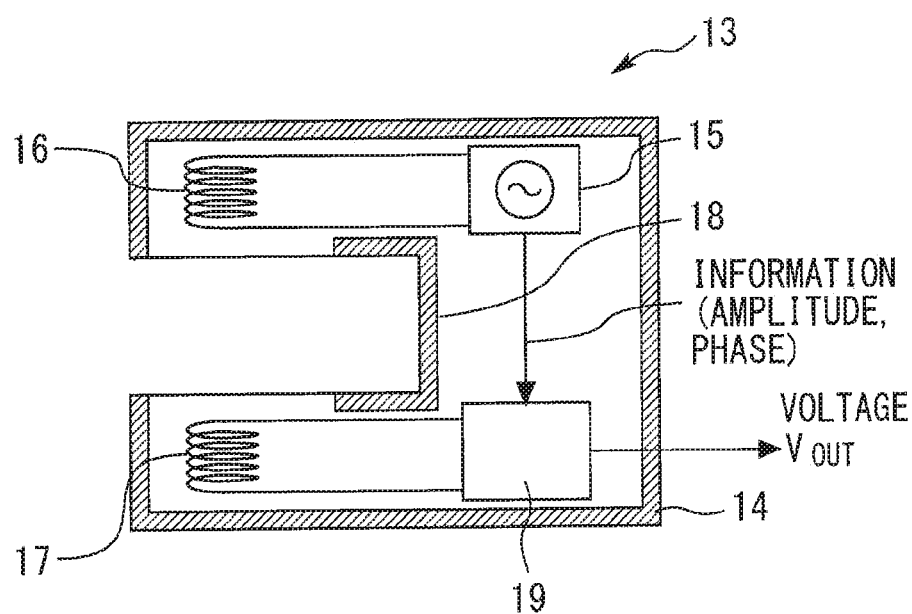
FIG. 11 is a plan view of an elevator car position detection sensor according to Embodiment 6 of the present invention.

FIG. 11 is a plan view of an elevator car position detection sensor according to Embodiment 6 of the present invention. Note that parts identical or corresponding to those in Embodiment 1 are denoted by the same reference numerals. The descriptions of the parts are omitted.

The determination circuit 19 according to Embodiment 6 determines the phase and amplitude of the voltage $V_2$ generated across the second coil 17.

According to Embodiment 6 described above, the determination circuit 19 determines the amplitude of the voltage $V_2$ generated across the second coil 17. In this case, a decrease or disappearance of the excitation magnetic field due to a failure can be detected based on the magnitude of the amplitude of the voltage $V_2$ generated across the second coil 17. In addition, a malfunction in the car position detection device 11, such as contamination of foreign materials in a U-shaped part of the car position detection sensor 13, other than the plate 12, can be detected. As a result, erroneous detection of presence or absence of the plate 12 can be more reliably suppressed.

Note that in Embodiments 1 to 6, the arrangement of the plate 12 and the car position detection sensor 13 may be replaced. In this case, the plate 12 is provided to the car 8. The car position detection sensor 13 is provided to the hoistway 1. In this case also, erroneous detection of presence or absence of the plate 12 can be suppressed.

Further, the shield wall 18 may be provided on a side closer to the plate 12. In this case, the shield wall 18 may be fixed to the end portion of the plate 12 through an insulator. In this case also, erroneous detection of presence or absence of the plate 12 can be suppressed.

INDUSTRIAL APPLICABILITY

As described above, elevator car position detection sensor according to the present invention can be used for a system that suppresses erroneous detection of presence or absence of a plate.

REFERENCE SIGNS LIST

1 Hoistway
2 Hall

3 Machine room
4 Hoisting machine
5 Sheave
6 Deflector sheave
7 Main rope
8 Car
9 Weight
10 Control device
11 Car position detection device
12 Plate
13 Car position detection sensor
14 Housing
15 Alternating current source
16 First coil
17 Second coil
18 Shield wall
19 Determination circuit
20 First yoke
21 Second yoke

The invention claimed is:

1. An elevator car position detection sensor comprising:
a first coil provided to one of an elevator car and a hoistway and configured to output an excitation magnetic field to a plate provided to the other of the elevator car and the hoistway;
a second coil provided on an opposite side of the first coil relative to the plate;
a shield wall configured to shield an end portion of the plate located closer to one of the car and the hoistway; and
a determination circuit configured to determine a phase of an alternating-current voltage corresponding to a frequency of the excitation magnetic field output from the first coil at an alternating-current voltage generated across the second coil, wherein
the shield wall shields an end portion of the plate located closer to one of the car and the hoistway at a side closer to the first coil and at a side closer to a tip end of the plate, without shielding the end portion of the plate at a side closer to the second coil.

2. The elevator car position detection sensor according to claim 1, further comprising:
a first yoke provided on an inside of the first coil; and
a second yoke provided on an inside of the second coil.

3. The elevator car position detection sensor according to claim 1, wherein the determination circuit determines a phase and an amplitude of the alternating-current voltage generated across the second coil.

4. An elevator car position detection sensor comprising:
a first coil provided to one of an elevator car and a hoistway and configured to output an excitation magnetic field to a plate provided to the other of the elevator car and the hoistway;
a second coil provided on an opposite side of the first coil relative to the plate;
a shield wall configured to shield an end portion of the plate located closer to one of the car and the hoistway; and
a determination circuit configured to determine a phase of an alternating-current voltage corresponding to a frequency of the excitation magnetic field output from the first coil at an alternating-current voltage generated across the second coil, wherein
the shield wall shields an end portion of the plate located closer to one of the car and the hoistway at a side closer to a tip end of the plate and at a side closer to second coil, without shielding the end portion of the plate at a side closer to the first coil.

5. An elevator car position detection sensor comprising:
a first coil provided to one of an elevator car and a hoistway and configured to output an excitation magnetic field to a plate provided to the other of the elevator car and the hoistway;
a second coil provided on an opposite side of the first coil relative to the plate;
a shield wall configured to shield an end portion of the plate located closer to one of the car and the hoistway; and
a determination circuit configured to determine a phase of an alternating-current voltage corresponding to a frequency of the excitation magnetic field output from the first coil at an alternating-current voltage generated across the second coil, wherein
the shield wall shields an end portion of the plate located closer to one of the car and the hoistway at a side closer to a tip end of the plate, without shielding the end portion of the plate at a side closer to the first coil and at a side closer to the second coil.

* * * * *